(12) United States Patent
Uemura

(10) Patent No.: US 9,749,059 B2
(45) Date of Patent: Aug. 29, 2017

(54) CURRENT OUTPUTTING CIRCUIT AND OPTICAL TRANSMITTER

(71) Applicant: KABUSHIKI KAISHA TOSHIBA, Minato-ku, Tokyo (JP)

(72) Inventor: Hiroshi Uemura, Kanagawa (JP)

(73) Assignee: KABUSHIKI KAISHA TOSHIBA, Tokyo (JP)

( * ) Notice: Subject to any disclaimer, the term of this patent is extended or adjusted under 35 U.S.C. 154(b) by 0 days.

(21) Appl. No.: 15/066,489

(22) Filed: Mar. 10, 2016

(65) Prior Publication Data

US 2017/0207857 A1 Jul. 20, 2017

(30) Foreign Application Priority Data

Jan. 14, 2016 (JP) ................. 2016-005092

(51) Int. Cl.

| H04B 10/04 | (2006.01) |
|---|---|
| H04B 10/12 | (2006.01) |
| H01S 3/00 | (2006.01) |
| H04B 10/564 | (2013.01) |
| H03K 17/687 | (2006.01) |
| H01S 5/042 | (2006.01) |
| H01S 5/183 | (2006.01) |

(Continued)

(52) U.S. Cl.
CPC ........... *H04B 10/564* (2013.01); *H01S 5/042* (2013.01); *H01S 5/183* (2013.01); *H03K 17/6871* (2013.01); *H04B 10/503* (2013.01); *H04B 10/60* (2013.01)

(58) Field of Classification Search
CPC .... H04B 10/564; H04B 10/503; H04B 10/60; H01S 5/042; H01S 5/183; H03K 17/6871
USPC ..... 398/157, 182, 193, 72; 372/38.02, 38.07
See application file for complete search history.

(56) References Cited

U.S. PATENT DOCUMENTS 5,563,898 A * 10/1996 Ikeuchi ................... H01S 5/042
372/38.07
5,708,673 A * 1/1998 Ikeuchi ................... H01S 5/042
372/29.01

(Continued)

FOREIGN PATENT DOCUMENTS

| JP | 07-302943 A | 11/1995 |
|---|---|---|
| JP | 2013-183147 A | 9/2013 |
| JP | 2015-005971 A | 1/2015 |

*Primary Examiner* — Ken N Vanderpuye
*Assistant Examiner* — Abbas H Alagheband
(74) *Attorney, Agent, or Firm* — Foley & Lardner LLP

(57) ABSTRACT

According to one embodiment, a current outputting circuit includes an output node, a first circuit outputting a first signal and a second signal based on an input signal, the first and second signals having phases of complementary relationship, and a second circuit outputting an output current from the output node based on the first and second signals. The second circuit includes a first current source with a first terminal and a second terminal, the first terminal being connected to a first power source, and a first transistor with a third terminal, a fourth terminal and a fifth terminal, the first signal being input to the third terminal, the fourth and fifth terminals sandwiching a first current path controlled by the first signal, the fourth terminal being connected to the second terminal, the fifth terminal being connected to the output node. The second signal is input to the fifth terminal.

14 Claims, 8 Drawing Sheets

(51) Int. Cl.
*H04B 10/50* (2013.01)
*H04B 10/60* (2013.01)

(56) References Cited

U.S. PATENT DOCUMENTS

| | | | | |
|---|---|---|---|---|
| 5,721,456 | A * | 2/1998 | Kebukawa | H04B 10/503 257/83 |
| 6,618,406 | B1 * | 9/2003 | Kaminishi | H01S 5/042 372/38.02 |
| 7,502,400 | B2 * | 3/2009 | Preisach | H01S 5/042 372/29.015 |
| 8,009,709 | B2 * | 8/2011 | Nelson | H01S 5/042 372/38.02 |
| 8,358,080 | B2 * | 1/2013 | Nakamura | H05B 39/04 315/209 R |
| 2002/0085599 | A1 * | 7/2002 | Schrodinger | H01S 5/042 372/38.02 |
| 2003/0156609 | A1 * | 8/2003 | Tsai | H01S 5/042 372/38.02 |
| 2003/0160636 | A1 * | 8/2003 | Fattaruso | H01S 5/042 327/65 |
| 2005/0276290 | A1 * | 12/2005 | Preisach | H01S 5/042 372/38.02 |
| 2009/0245812 | A1 * | 10/2009 | Tokita | H01S 5/02284 398/187 |
| 2009/0268767 | A1 * | 10/2009 | Nelson | H03K 17/16 372/38.02 |
| 2010/0135675 | A1 * | 6/2010 | Tanaka | H01S 5/06213 398/192 |
| 2013/0121356 | A1 * | 5/2013 | Sugawara | H05B 33/0845 372/38.02 |
| 2013/0308669 | A1 * | 11/2013 | Nogami | H01S 5/0427 372/38.07 |
| 2013/0322886 | A1 * | 12/2013 | Uemura | H04B 10/50 398/135 |
| 2014/0376582 | A1 * | 12/2014 | Kao | H01S 5/042 372/38.01 |
| 2015/0155949 | A1 * | 6/2015 | Nguyen | H04B 10/2504 398/201 |

* cited by examiner

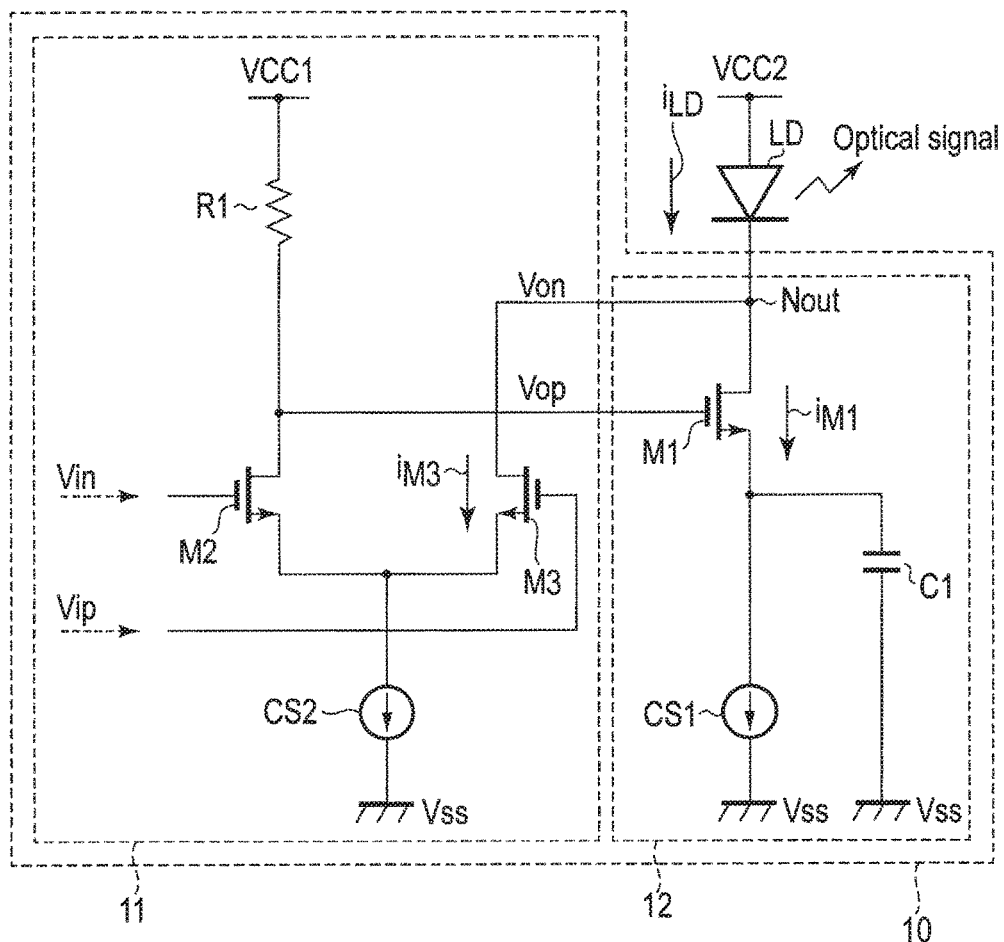
F I G. 1

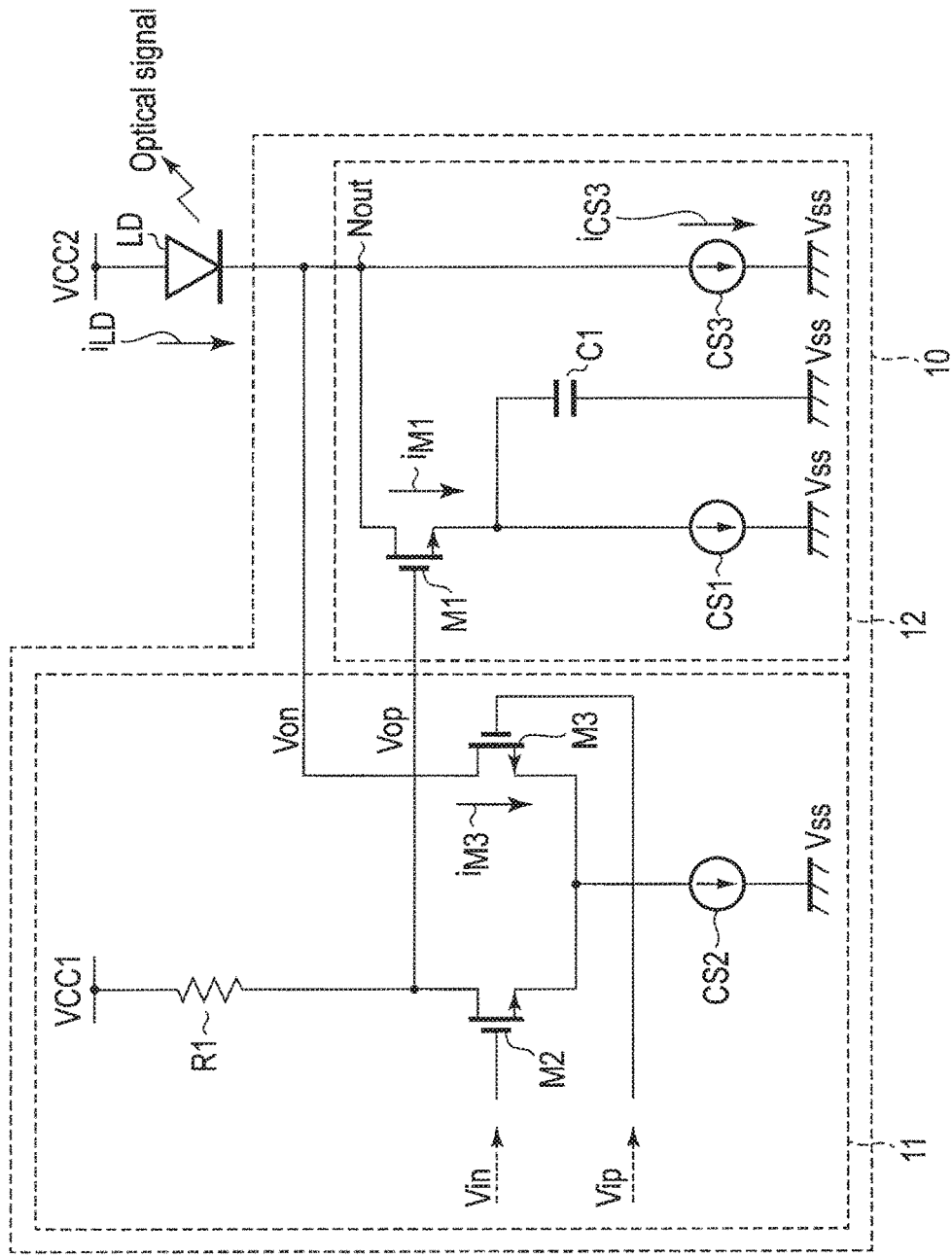
F I G. 5

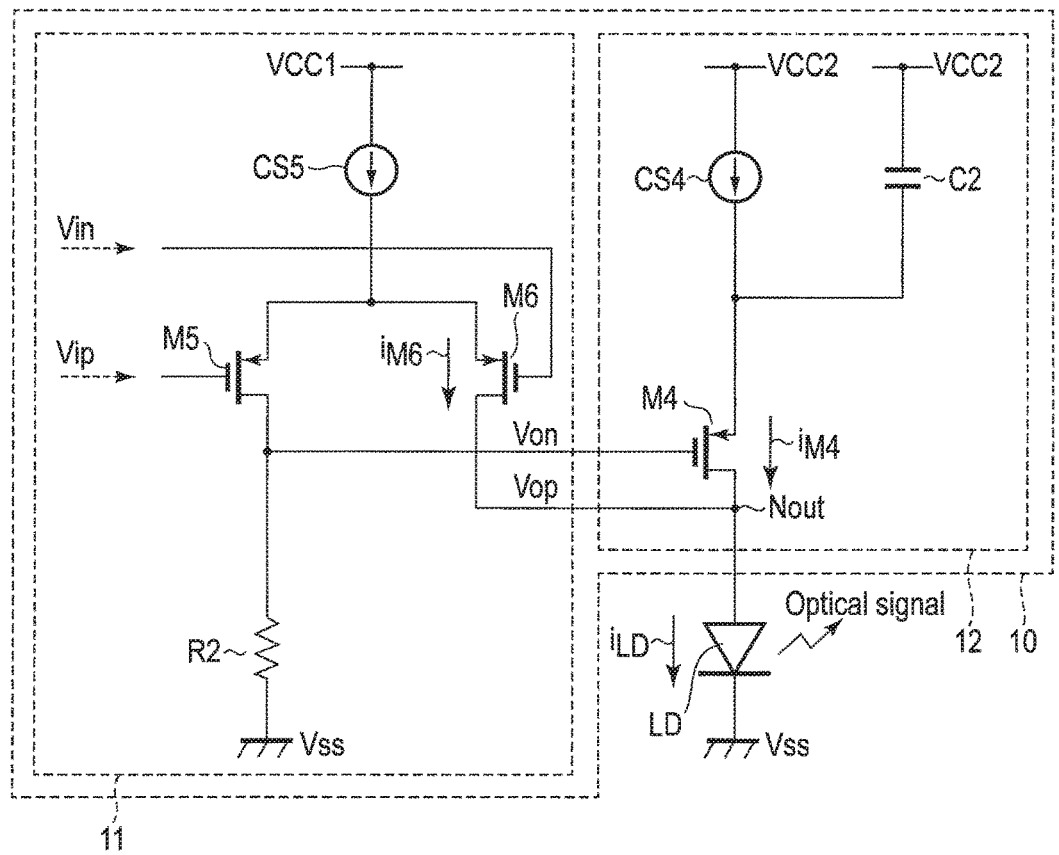
F I G. 7
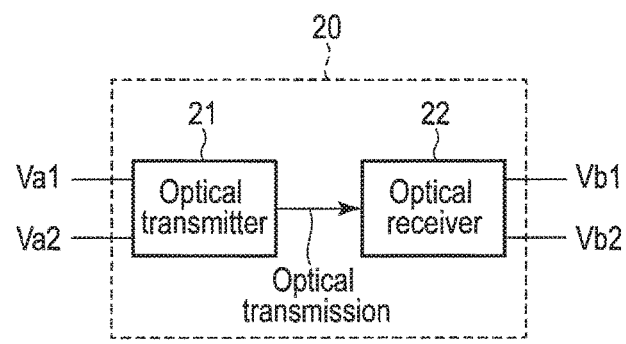
F I G. 8

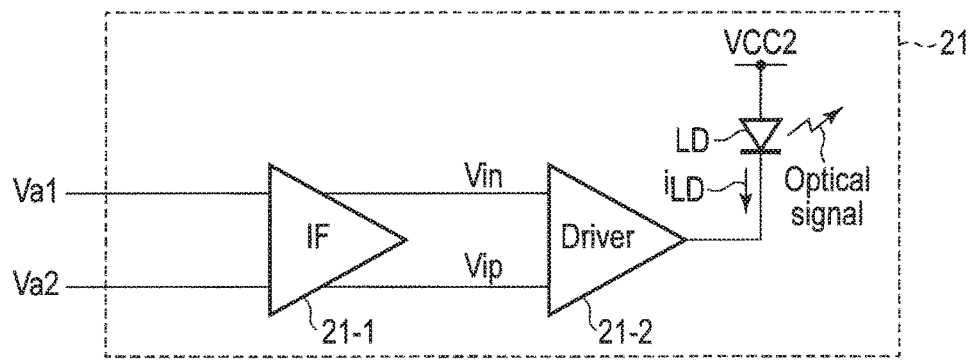
F I G. 9
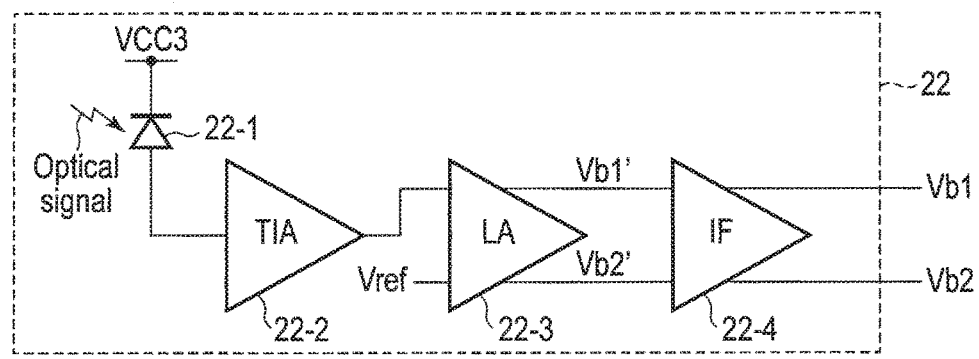
F I G. 10
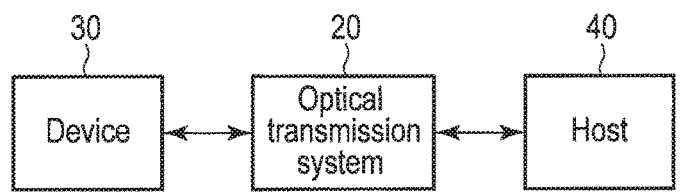
F I G. 11

CURRENT OUTPUTTING CIRCUIT AND OPTICAL TRANSMITTER

CROSS-REFERENCE TO RELATED APPLICATIONS

This application is based upon and claims the benefit of priority from Japanese Patent Application No. 2016-005092, filed Jan. 14, 2016, the entire contents of which are incorporated herein by reference.

FIELD

Embodiments described herein relate generally to a current outputting circuit and an optical transmitter.

BACKGROUND

The importance of increase in the signal transmission rate at information communication devices increases as the information society is developed and the performance of electronic devices becomes higher. The optical transmission is a key technology to achieve the increase in the signal transmission rate.

BRIEF DESCRIPTION OF THE DRAWINGS

FIG. 1 is a diagram showing an optical transmitter of an embodiment.

FIG. 5 is a diagram showing a first modified example of the optical transmitter.

FIG. 7 is a diagram showing a third modified example of the optical transmitter.

FIG. 8 is s diagram showing an optical transmission system as an example of application.

FIG. 9 is a diagram showing an example of an optical transmitter.

FIG. 10 is a diagram showing an example of an optical receiver.

FIG. 11 is a diagram showing a storage system as an example of application.

DETAILED DESCRIPTION

Figure 2:
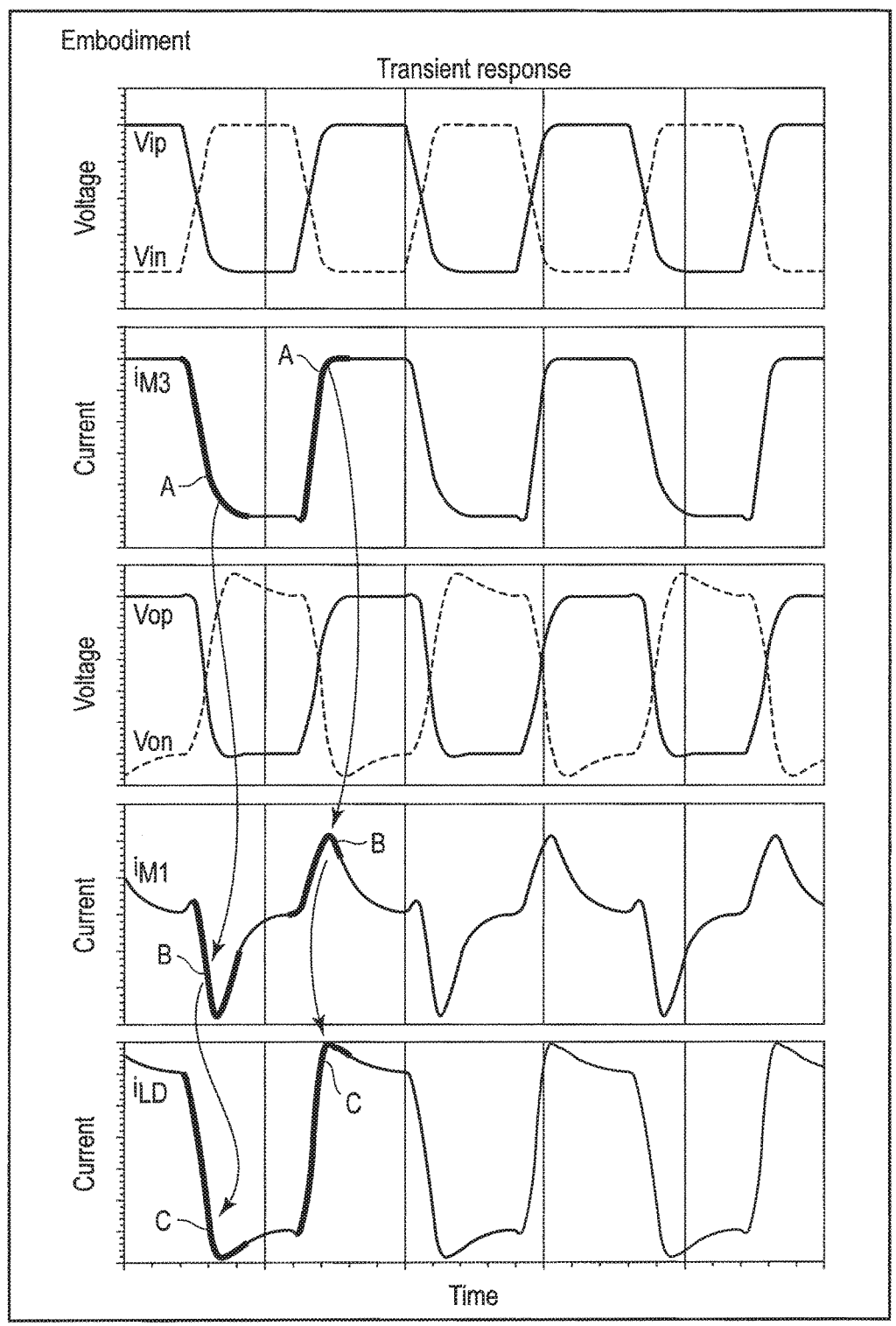
FIG. 2 is a chart showing a relationship between an input voltage and an output current in the optical transmitter shown in FIG. 1.

In general, according to one embodiment, a current outputting circuit comprises: an output node; a first circuit outputting a first signal and a second signal based on an input signal, the first and second signals having phases of complementary relationship; and a second circuit outputting an output current from the output node based on the first and second signals. The second circuit comprises: a first current source with a first terminal and a second terminal, the first terminal being connected to a first power source; and a first transistor with a third terminal, a fourth terminal and a fifth terminal, the first signal being input to the third terminal, the fourth and fifth terminals sandwiching a first current path controlled by the first signal, the fourth terminal being connected to the second terminal, the fifth terminal being connected to the output node. The second signal is input to the fifth terminal.

One of embodiments will be described hereinafter with reference to the accompanying drawings.

Embodiment

FIG. 1 is a diagram showing an example of an optical transmitter.

The optical transmitter comprises a current outputting circuit 10 which outputs an output current $i_{LD}$ from an output node Nout and a light emitting element LD driven with the output current $i_{LD}$.

The light emitting element LD is connected between the output node Nout of the current outputting circuit 10 and a power source (for example, 3.3V) VCC2. The light emitting element LD is, for example, a vertical cavity surface emitting laser (VCSEL). The light emitting element LD generates an optical signal, based on the output current $i_{LD}$.

The current outputting circuit 10 comprises a modulated current circuit 11 which generates a modulated current $i_{M3}$ and a bias current circuit 12 which generates a bias current $i_{M1}$. The output current $i_{LD}$ is a current obtained by summing the bias current $i_{M1}$ and the modulated current $i_{M3}$. In other words, $i_{LD}$ is equal to $i_{M1}+i_{M3}$.

First, the bias current circuit 12 will be explained.

The bias current circuit 12 comprises a current source CS1, a transistor M1 and a capacitor C1. The current source CS1 includes two current terminals. One of two current terminals of the current source CS1 is connected to a power source (for example, 0V) Vss. The transistor M1 comprises a control terminal to which the modulated voltage Vop is input, and two current terminals which sandwich a current path controlled with the modulated voltage Vop. One of two current terminals of the transistor M1 is connected to the other current terminal of the current source CS1. The other current terminal of the transistor M1 is connected to the output node Nout. The capacitor C1 comprises two terminals. One of two terminals of the capacitor C1 is connected to the power source Vss and the other terminal is connected to one of two current terminals of the transistor M1. The capacitor C1 comprises, for example, a capacitance of 200 fF. One of two terminals of the capacitor C1 may be connected to the power source VCC1 or VCC2.

The modulated voltage Von is input to the other current terminal of the transistor M1.

The current source CS1 is, for example, an N-channel Metal-Oxide-Semiconductor (MOS) field effect transistor (FET) in which a certain voltage is applied to a gate. The current source CS1 may be, for example, a resistance element. The transistor M1 is, for example, an N-channel MOSFET in which the modulated voltage Vop is input to a gate (control terminal). The capacitor C1 may be an independent element or may use a parasitic capacitance of interconnects, circuit elements and the like. In the latter case, the capacitor serving as an independent element can be omitted.

In the bias current circuit 12, the bias current $i_{M1}$ includes a direct current and an auxiliary current. The direct current depends on the current source CS1. The direct current is desirably larger than a threshold current for the light emitting element LD to execute laser oscillation. The auxiliary current depends on the modulated voltage Vop, the transistor M1 and the capacitor C1.

Next, the modulated current circuit 11 will be explained.

The modulated current circuit 11 comprises a current source CS2, transistors M2 and M3, and a resistance element R1.

The current source CS2 includes two current terminals. One of two current terminals of the current source CS2 is connected to the power source Vss.

The transistor M2 comprises a control terminal to which one of input signals (differential signals) Vip and Vin, i.e., the input signal Vin is input, and two current terminals which sandwich a current path controlled with the input signal Vin. One of two current terminals of the transistor M2 is connected to the other current terminal of the current source CS2. The other current terminal of the transistor M2 is connected to the power source (for example, 1.2V) VCC1 via the resistance element R1.

The modulated voltage Vop is output from the other current terminal of the transistor M2. In other words, the other current terminal of the transistor M2 is connected to the control terminal of the transistor M1 in the bias current circuit 12.

The transistor M3 comprises a control terminal to which one of the input signals (differential signals) Vip and Vin, i.e., the input signal Vip is input, and two current terminals which sandwich a current path controlled with the input signal Vip. One of two current terminals of the transistor M3 is connected to the other current terminal of the current source CS2.

The modulated voltage Von is output from the other current terminal of the transistor M3. In other words, the other current terminal of the transistor M3 is connected to the other current terminal of the transistor M1 in the bias current circuit 12.

The current source CS2 is, for example, an N-channel MOSFET in which a certain voltage is applied to a gate. The current source CS2 may be, for example, a resistance element. The transistor M2 is, for example, an N-channel MOSFET in which the input signal Vin is input to a gate (control terminal). The transistor M3 is, for example, an N-channel MOSFET in which the input signal Vip is input to a gate (control terminal).

A transistor may be used instead of the resistance element R1. In addition, an inductor element may be added between the resistance element R1 and the power source VCC1, for increase in signal transmission rate.

In the modulated current circuit 11, modulated voltages Vop and Von depend on the electric signals (differential signals) Vip and Vin, which are input signals, and have phases in a complementary relationship.

The modulated voltage Vop makes rise and fall of the output current $i_{LD}$ steep. In other words, the modulated voltage Vop makes the rise and fall of the output current $i_{LD}$ steep by generating the auxiliary current of the bias current $i_{M1}$. In addition, the auxiliary current is generated by charging and discharging of the control terminal of the transistor M1, and charging and discharging of the capacitor C1. The energy consumption caused by generation of the auxiliary current is therefore very small (for example, equal to or lower than 100 µW).

The modulated current circuit 11 comprises the differential amplification circuit as explained above. This is because the input signals Vip and Vin are differential signals effective for a high-speed signal transmission (i.e., a normal phase signal and a reverse phase signal having phases in the complementary relationship). In contrast, an optical signal is a single-ended signal to suppress increase in the costs, in the optical transmission.

Thus, in general, one of two output signals of the differential amplification circuit, i.e., the modulated voltage Von from a drain of the transistor M3 is supplied to the output node Nout of the current output circuit 10 while the other signal, i.e., the signal from a drain of the transistor M2 is not used.

In the present embodiment, however, the other output signal of the differential amplification circuit, i.e., the modulated voltage Vop from the drain of the transistor M2 is also used. As explained above, the modulated voltage Vop is input to the control terminal of the transistor M1 to generate the auxiliary current. Thus, in the present embodiment, the rise and fall of the output current $i_{LD}$ can be made steep without providing a complicated circuit to generate the auxiliary current (i.e., increasing the energy consumption), by effectively utilizing two output signals of the differential amplification circuit.

For increase in signal transmission rate, the transistors M1, M2 and M3 are, desirably, transistors for the power source VCC1, in the optical transmitter shown in FIG. 1. If the power source VCC1 is set at 1.2V and the power source VCC2 is set at 3.3V in a case where the forward voltage of the light emitting element LD is equal to or higher than 2.1V, a voltage exceeding the power source VCC1 cannot be applied to the transistor M1, M2 or M3. The reliability of the transistors M1, M2 and M3 can be thereby improved.

For further increase in the reliability, the power source VCC1 may be set at 3.3V. Alternatively, transistors for the power source VCC2 may be cascoded between the output node Nout and the transistors M1 and M3.

In addition, the input signals Vip and Vin are the differential signals (i.e., the normal phase signal and reverse phase signal having phases in the complementary relationship) but may be single-ended signals. In this case, for example, the input signal (normal phase signal) Vip may be input to the control terminal of the transistor M3 and an average voltage of the input signal may be input to the control terminal of the transistor M2. The modulated voltages Vop and Von can be thereby obtained similarly to the present case.

FIG. 2 shows a relationship between the input voltage and the output current in the optical transmitter shown in FIG. 1.

Vip, Vin, $i_{M3}$, Vop, Von, $i_{M1}$, and $i_{LD}$ in FIG. 2 correspond to Vip, Vin, $i_{M3}$, Vop, Von, $i_{M1}$, and $i_{LD}$ in FIG. 1, respectively.

The modulation speeds of the input signals (input voltages) Vip and Vin are, for example, approximately 12 Gbps and the voltage values of the input signals vary in a range between approximately 700 mV and approximately 1100 mV. The modulated current $i_{M3}$ is a drain current of the transistor (FET) M3 shown in FIG. 1 and varies synchronously with the modulated voltage Vip. In other words, if the modulated voltage Vip becomes at a high level, the modulated current $i_{M3}$ also becomes at a high level and, if the modulated voltage Vip becomes at a low level, the modulated current $i_{M3}$ also becomes at a low level. For example, the current value of the modulated current $i_{M3}$ varies in a range between approximately 0 mA and approximately 5 mA. The maximum value of the modulated current $i_{M3}$ is substantially equal to that of a direct current (for example, approximately 5 mA) flowing through the current source CS2 shown in FIG. 1.

For example, the voltage values of the modulated voltages Vop and Von vary in a range between approximately 950 mV and approximately 1200 mV.

The bias current $i_{M1}$ is the drain current of the transistor (MOSFET) M1 shown in FIG. 1. The direct current of the bias current $i_{M1}$ is substantially equal to the direct current (for example, approximately 3 mA) flowing through the current source CS1 shown in FIG. 1. In addition, the transistor M1 shown in FIG. 1 functions as a source follower circuit. When the modulated voltage Vop varies, the source of the transistor M1 shown in FIG. 1 varies in the same phase as the phase of the modulated voltage Vop.

Consequently, a displacement current (auxiliary current) synchronized with the modulated voltage Vop flows to the capacitor C1 shown in FIG. 1. For example, the modulated voltage Vop causes a negative peak current (having a peak height from the center of the waveform of approximately −1.0 mA to −1.5 mA) to be generated in the bias current $i_{M1}$ due to the fall of the modulated voltage. In addition, the modulated voltage Vop causes a positive peak current (having a peak height from the center of the waveform of approximately 1.0 mA to 1.5 mA) to be generated in the bias current $i_{M1}$ due to the rise of the modulated voltage.

The output current ILD is a current obtained by summing the bias current $i_{M1}$ and the modulated current $i_{M3}$.

A slew rate (signal variation per unit time) of the rise and fall (thick lines A) of the modulated current $i_{M3}$ becomes low due to, for example, a parasitic capacitance of the light emitting element LD. However, the peak currents (thick lines B) of the bias current $i_{M1}$ compensate for the rise and fall of the modulated current $i_{M3}$. The slew rate of the rise and fall (thick lines C) of the output current $i_{LD}$ is thereby improved.

Figure 3:
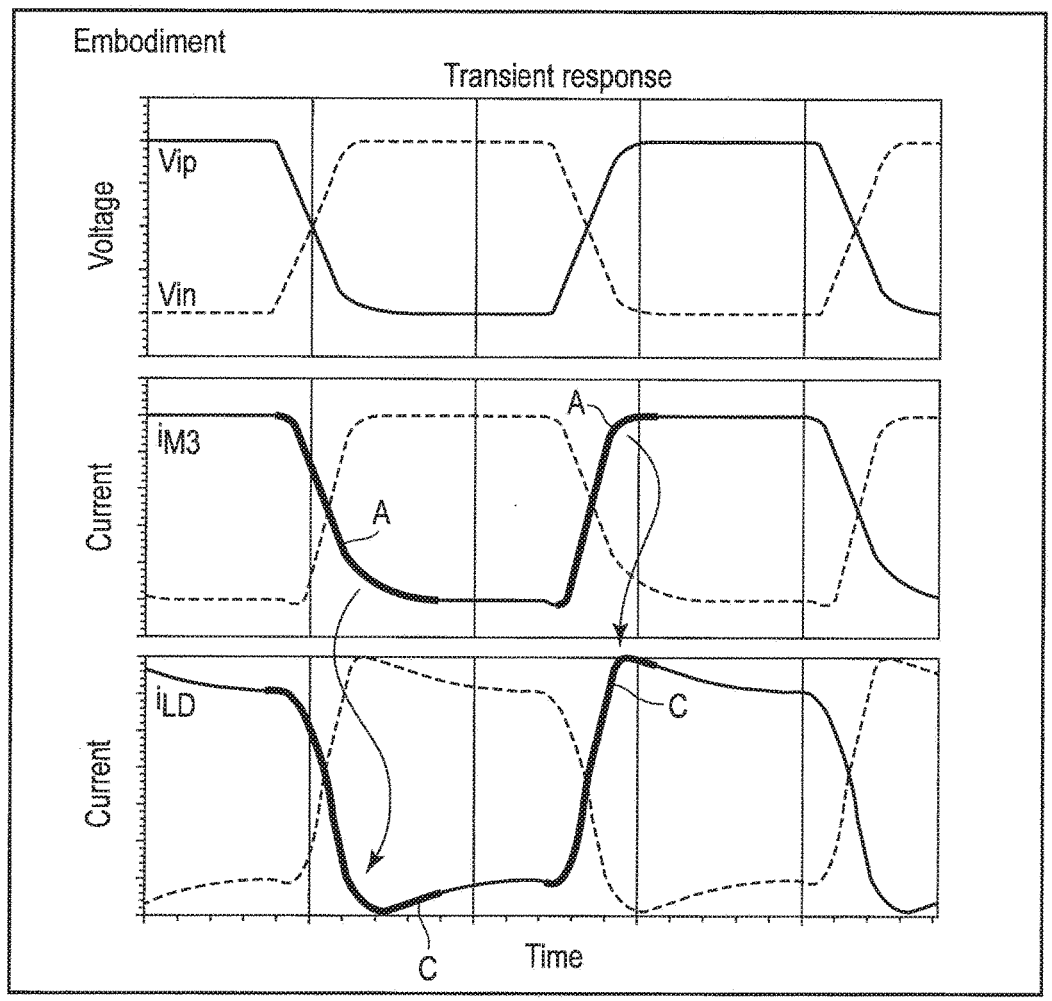
FIG. 3 is a chart showing eye patterns of the embodiment.

FIG. 3 shows eye patterns of Vip, Vin, $i_{M3}$ and $i_{LD}$ shown in FIG. 2.

An eye pattern is a waveform chart in which waveform data is sampled and superposed.

In FIG. 3, similarly to FIG. 2, the slew rate of the rise and fall (thick lines A) of the modulated current $i_{M3}$ is low, but the slew rate of the output current $i_{LD}$ is improved and the output current $i_{LD}$ has steep rise and fall (thick lines C). Therefore, the pulse width can be reduced and the increase in signal transmission rate in the current outputting circuit shown in FIG. 1 can be attempted.

The light emitting element LD generates the optical signal proportional to the drive current (output current $i_{LD}$) when the drive current is equal to or higher than a threshold current which causes the laser oscillation and equal to or lower than a saturation current which causes occurrence of the saturation of the optical output. For this reason, if the slew rate of the rise and fall of the drive current (output current $i_{LD}$) is improved in a case where the operating band of the light emitting element LD is sufficiently high, the slew rate of the rise and fall of the optical signal is also improved. The signal transmission rate in the optical transmitter shown in FIG. 1 can be increased.

Figure 4:
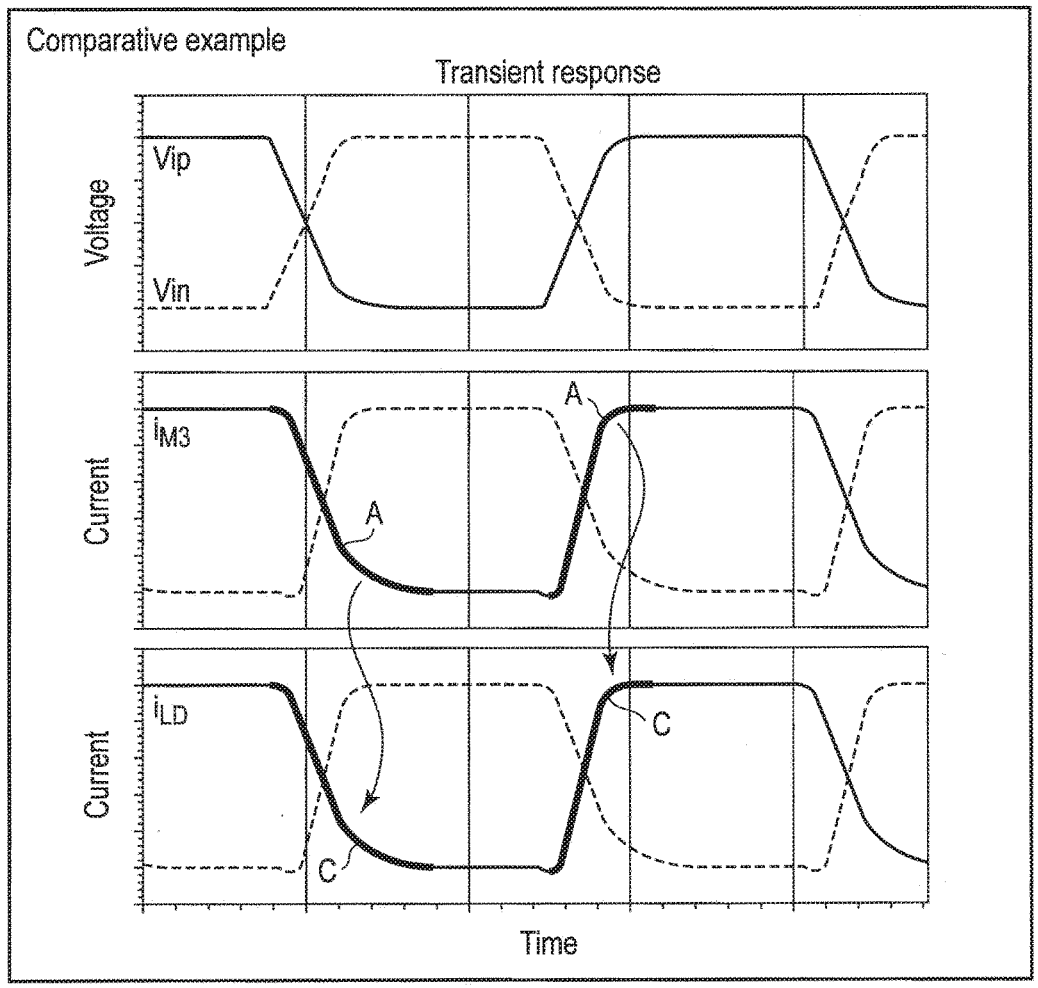
FIG. 4 is a chart showing eye patterns of a comparative embodiment.

In contrast, each of the rise and fall (thick lines A) of the modulated current $i_{M3}$ becomes the output current $i_{LD}$ as it is, in a comparative example (eye patterns) shown in FIG. 4. For this reason, the slew rate of the rise and fall (thick lines C) of the output current $i_{LD}$ remains low and the optical transmission rate can hardly be increased. In the comparative example, however, the transistor M1 and the capacitor C1 are removed from the optical transmitter shown in FIG. 1.

Thus, according to the present embodiment, the increase in signal transmission rate in the current outputting circuit and the increase in data transfer rate in the optical transmitter can be accomplished by making the rise and fall of the output current of the current outputting circuit steep.

Modified Example

FIG. 5 shows a first modified example of the optical transmitter.

The present example is a modified example of the bias current circuit 12 of the optical transmitter shown in FIG. 1. Since a modulated current circuit 11 of the optical transmitter of the present example is the same as the modulated current circuit 11 of the optical transmitter shown in FIG. 1, the constituent elements in the modulated current circuit are denoted by the same reference numerals as those in FIG. 1 and detailed explanations are omitted.

The bias current circuit 12 comprises the current source CS1, a current source CS3, the transistor M1, and the capacitor C1. The current source CS1 includes two current terminals. One of two current terminals of the current source CS1 is connected to a power source (for example, 0V) Vss. The current source CS3 includes two current terminals. One of two current terminals of the current source CS3 is connected to the power source Vss and the other current terminal is connected to the output node Nout of the current output circuit 10.

The transistor M1 comprises a control terminal to which the modulated voltage Vop is input, and two current terminals which sandwich a current path controlled with the modulated voltage Vop. One of two current terminals of the transistor M1 is connected to the other current terminal of the current source CS1. The other current terminal of the transistor M1 is connected to the output node Nout.

The capacitor C1 comprises two terminals. One of two terminals of the capacitor C1 is connected to the power source Vss and the other terminal is connected to one of two current terminals of the transistor M1. The capacitor C1 comprises, for example, a capacitance of 200 fF. One of two terminals of the capacitor C1 may be connected to the power source VCC1 or VCC2.

The modulated voltage Von is input to the other current terminal of the transistor M1.

Each of the current sources CS1 and CS3 is, for example, an N-channel Metal-Oxide-Semiconductor (MOS) field effect transistor (FET) in which a certain voltage is applied to a gate. The current sources CS1 and CS3 may be, for example, resistance elements. The transistor M1 is, for example, an N-channel MOSFET in which the modulated voltage Vop is input to a gate (control terminal). The capacitor C1 may be an independent element or may use a parasitic capacitance of interconnects, circuit elements and the like. In the latter case, the capacitor serving as an independent element can be omitted.

In the bias current circuit 12, a direct current included in the bias current is a sum of the direct current of the bias current $i_{M1}$ flowing to the transistor M1, and the direct current iCS3 of the current source CS3. If the direct current of the bias current of the bias current circuit 12 shown in FIG. 5 is the same as the direct current of the bias current of the bias current circuit 12 shown in FIG. 1, the magnitude of the auxiliary current alone can be controlled without varying the magnitude of the direct current, by varying a proportion between the current sources CS1 and CS3. This indicates that the slew rate of the rise and fall of the output current $i_{LD}$ output from the current output circuit 10 can be controlled finely. Therefore, the waveform of the output current $i_{LD}$ can be controlled finely and the reliability on the high-speed signal transmission can be further increased.

Figure 6:
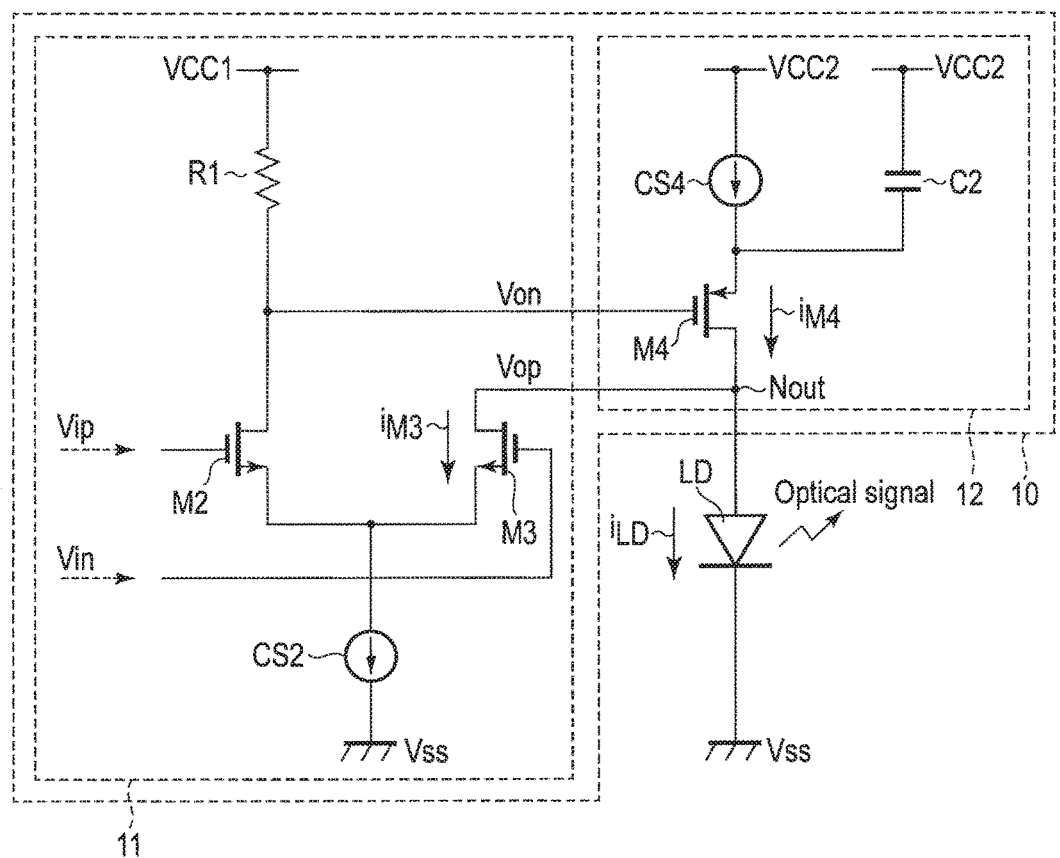
FIG. 6 is a diagram showing a second modified example of the optical transmitter.

FIG. 6 shows a second modified example of the optical transmitter.

The present example is also a modified example of the bias current circuit 12 of the optical transmitter shown in FIG. 1. Since a modulated current circuit 11 of the optical transmitter of the present example is the same as the modulated current circuit 11 of the optical transmitter shown in FIG. 1, the constituent elements in the modulated current circuit are denoted by the same reference numerals as those in FIG. 1 and detailed explanations are omitted.

In the optical transmitter shown in FIG. 1, the output current $i_{LD}$ flows in the direction of being input into the current outputting circuit 10. For this reason, the anode of the light emitting element LD is connected to the power source VCC2 and the cathode of the light emitting element LD is connected to the output node Nout. In contrast, in the optical transmitter of the present example, the output current $i_{LD}$ flows in the direction of being output from the current outputting circuit 10. For this reason, the anode of the light emitting element LD is connected to the output node Nout and the cathode of the light emitting element LD is connected to the power source Vss. In addition, the output current $i_{LD}$ is a current obtained by subtracting the modulated current $i_{M3}$ from a bias current $i_{M4}$. In other words, $i_{LD}$ is equal to $i_{M4}-i_{M3}$.

The bias current circuit 12 comprises a current source CS4, a transistor M4 and a capacitor C2. The current source CS4 includes two current terminals. One of two current terminals of the current source CS4 is connected to the power source (for example, 3.3V) VCC2.

The transistor M4 comprises a control terminal to which the modulated voltage Von is input and two current terminals which sandwich the current path controlled with the modulated voltage Von. One of two current terminals of the transistor M4 is connected to the other current terminal of the current source CS4. The other current terminal of the transistor M4 is connected to the output node Nout.

The capacitor C2 comprises two terminals. One of two terminals of the capacitor C2 is connected to the power source VCC2 and the other terminal is connected to one of two current terminals of the transistor M4. The capacitor C2 comprises, for example, a capacitance of 200 fF. One of two terminals of the capacitor C2 may be connected to the power source Vss or VCC1.

The modulated voltage Vop is input to the other current terminal of the transistor M4.

The current source CS4 is, for example, a P-channel Metal-Oxide-Semiconductor (MOS) field effect transistor (FET) in which a certain voltage is applied to a gate. The current source CS4 may be, for example, a resistance element. The transistor M4 is, for example, a P-channel MOSFET in which the modulated voltage Von is input to a gate (control terminal). The capacitor C2 may be an independent element or may use a parasitic capacitance of interconnects, circuit elements and the like. In the latter case, the capacitor serving as an independent element can be omitted.

In the bias current circuit 12, the anode of the light emitting element LD is connected to the output node Nout of the current output circuit 10 and the cathode of the light emitting element LD is connected to the power source (for example, 0V) Vss. In addition, the input signals Vip and Vin are the differential signals (i.e., the normal phase signal and reverse phase signal having phases in the complementary relationship). In this case, the input signal (normal phase signal) Vip is input to the control terminal of the transistor M2 and the input signal (reverse phase signal) Vin is input to the control terminal of the transistor M3.

In the present example, unlike the optical transmitter shown in FIG. 1, if the modulated voltage Vip becomes at a high level, the modulated current $i_{M3}$ becomes at a low level and, if the modulated voltage Vip becomes at a low level, the modulated current $i_{M3}$ becomes at a high level. As explained above, however, the output current $i_{LD}$ is a current obtained by subtracting the modulated current $i_{M3}$ from the bias current $i_{M4}$. Thus, if the modulated voltage Vip becomes at a high level, the output current $i_{LD}$ also becomes at a high level and, if the modulated voltage Vip becomes at a low level, the output current $i_{LD}$ also becomes at a low level.

In the present example, too, the rise and fall of the output current $i_{LD}$ of the current outputting circuit 10 can be made steep by generating the auxiliary current by the transistor M4. The increase in signal transmission rate in the current outputting circuit 10 and the increase in the data transfer rate in the optical transmitter can be therefore accomplished.

In the present example, desirably, the transistors M2 and M3 are transistors for the power source VCC1, and the transistor M4 is a transistor for the power source VCC2. When the forward voltage of the light emitting element LD is equal to or higher than 2.1V, the power source VCC1 of the current outputting circuit 10 may be set at 3.3V since the voltage of the output node Nout is also equal to or higher than 2.1V. Alternatively, the power source VCC1 may be set at 1.2V and, to increase the reliability, the transistor for the power source VCC2 may be cascoded to the drain terminal of the transistor M3.

In addition, the input signals Vin and Vip are the differential signals (i.e., the normal phase signal and reverse phase signal having phases in the complementary relationship) but may be single-ended signals. In this case, for example, the input signal (normal phase signal) Vip may be input to the control terminal of the transistor M2 and an average voltage of the input signal may be input to the control terminal of the transistor M3.

FIG. 7 shows a third modified example of the optical transmitter.

The present example is a modified example of the modulated current circuit 11 of the optical transmitter shown in FIG. 6. Since the bias current circuit 12 of the present example is the same as the bias current circuit 12 of the optical transmitter shown in FIG. 6, the bias current circuit is denoted by the same reference numeral as that in FIG. 6 and its detailed explanation is omitted.

In the present example, the output current $i_{LD}$ is a current obtained by summing the bias current $i_{M4}$ and the modulated current $i_{M6}$. In other words, $i_{LD}$ is equal to $i_{M4}+i_{M6}$.

The modulated current circuit 11 comprises a current source CS5, transistors M5 and M6, and a resistance element R2.

The current source CS5 includes two current terminals. One of two current terminals of the current source CS5 is connected to the power source (for example, 3.3V) VCC1.

The transistor M5 comprises a control terminal to which one of the input signals (differential signals) Vip and Vin, i.e., the input signal Vip is input, and two current terminals which sandwich a current path controlled by the input signal Vip. One of two current terminals of the transistor M5 is connected to the other current terminal of the current source CS5. The other current terminal of the transistor M5 is connected to the power source (for example, 0V) Vss via the resistance element R2.

The modulated voltage Von is output from the other current terminal of the transistor M5. In other words, the other current terminal of the transistor M5 is connected to the control terminal of the transistor M4 in the bias current circuit 12.

The transistor M6 comprises a control terminal to which one of input signals (differential signals) Vip and Vin, i.e., the input signal Vin is input, and two current terminals which sandwich a current path controlled by the input signal Vin.

One of two current terminals of the transistor M6 is connected to the other current terminal of the current source CS5.

The modulated voltage Vop is output from the other current terminal of the transistor M6. In other words, the other current terminal of the transistor M6 is connected to the other current terminal of the transistor M4 in the bias current circuit 12.

The current source CS5 is, for example, a P-channel Metal-Oxide-Semiconductor (MOS) field effect transistor (FET) in which a certain voltage is applied to a gate. The current source CS5 may be, for example, a resistance element. The transistor M5 is, for example, a P-channel MOSFET in which the input signal Vip is input to a gate (control terminal). The transistor M6 is, for example, a P-channel MOSFET in which the input signal Vin is input to a gate (control terminal).

In the modulated current circuit 11, modulated voltages Vop and Von depend on the electric signals (differential signals) Vip and Vin, which are input signals, and have phases in the complementary relationship.

The modulated voltage Von makes the rise and fall of the output current $i_{LD}$ steep. In other words, the modulated voltage Von makes the rise and fall of the output current $i_{LD}$ steep by generating the auxiliary current of the bias current $i_{M4}$. In addition, the auxiliary current is generated by charging and discharging of the control terminal of the transistor M4, and charging and discharging of the capacitor C2. The energy consumption caused by generation of the auxiliary current is therefore very small (for example, equal to or lower than 100 μW).

In the present example, desirably, the transistors M5 and M6 are transistors for the power source VCC1, and the transistor M4 is a transistor for the power source VCC2. For smaller energy consumption, the value of the power source VCC1 may be set to be equal to or smaller than the value of the power source VCC2.

In addition, the input signals Vip and Vin are the differential signals (i.e., the normal phase signal and reverse phase signal having phases in the complementary relationship) but may be single-ended signals. In this case, for example, the input signal (normal phase signal) Vip may be input to the control terminal of the transistor M5 and an average voltage of the input signal may be input to the control terminal of the transistor M6.

In the present example, too, the rise and fall of the output current $i_{LD}$ of the current outputting circuit 10 can be made steep by generating the auxiliary current by the transistor M6. The increase in signal transmission rate in the current outputting circuit 10 and the increase in the data transfer rate in the optical transmitter can be therefore accomplished.

(Other Features)

The light emitting element alone is connected to the output node of the current outputting circuit, in the above-explained embodiment and modified examples. However, a light emitting element and a resistance element in a parallel connection may be connected between the output node and the power source in the current outputting circuit. In this case, higher-speed data transmission can be implemented since the load on the modulated current circuit becomes small. In this case, however, energy consumption is increased since the currents (direct currents) of the current sources CS1 to CS5 need to be increased to cause the same current as that in the case of connecting the light emitting element LD alone to flow to the light emitting element LD. Thus, if lower energy consumption is noticed, the light emitting element alone is desirably connected to the output node of the current outputting circuit.

(Example of Application)

An example of an optical transmission system comprising the above-explained optical transmitter will be explained.

FIG. 8 shows an example of an optical transmission system.

An optical transmission system 20 comprises an optical transmitter 21 which converts electric signals (differential signals) Va1 and Va2 into optical signals and transmits the optical signals, and an optical receiver 22 which receives the optical signals and converts the optical signals into electric signals (differential signals) Vb1 and Vb2. The optical signals are transmitted by, for example, an optical cable including an optical fiber.

The optical signals are transmitted unidirectionally in the present example, but may be capable of being transmitted bidirectionally. For example, if the optical transmitter 21 and the optical receiver 22 are optical transceivers capable of optical transmission and reception, the bidirectional transmission of the optical signals can be executed. In either of the cases, the number of channels of the optical signals may be single or plural. In addition, if the bidirectional transmission of the optical signals can be executed, the number of channels may be varied in accordance with the direction of transmission of the optical signals.

FIG. 9 shows an example of the optical transmitter.

The optical transmitter 21 comprises an interface (IF) 21-1 which amplifies the electric signals Va1 and Va2, a current outputting circuit (Driver) 21-2 which outputs the output current $i_{LD}$, based on output signals Vin and Vip of the interface 21-1, and a light emitting element LD which emits an optical signal such as a vertical cavity surface emitting laser (VCSEL), based on the output current $i_{LD}$.

The current outputting circuit 21-2 is, for example, the current outputting circuit shown in FIG. 1, FIG. 5, and the like. In addition, the current outputting circuit 21-2 and the light emitting element LD can be replaced with, for example, the current outputting circuit and the light emitting element shown in FIG. 6, FIG. 7, and the like.

FIG. 10 shows an example of the optical receiver.

The optical receiver 22 comprises a photodetector 22-1 which converts an optical signal into an electric signal (current signal), such as a p-i-n photodiode (PD), a trans-impedance amplifier (TIA) 22-2 which converts the current signal generated by the photodetector 22-1 into a voltage signal, a limiting amplifier (LA) 22-3 which amplifies an output signal of the trans-impedance amplifier 22-2, and an interface (IF) 22-4 which outputs the output signals Vb1 and Vb2, based on output signals Vb1' and Vb2' of the limiting amplifier 22-3.

The trans-impedance amplifier 22-2 receives a single-ended input, which may be replaced with a differential input. The output signal of the trans-impedance amplifier 22-2 is a single-ended signal, but may be replaced with a differential signal.

The limiting amplifier 22-3 converts the single-ended signal from the trans-impedance amplifier 22-2 into a differential signal by comparing the output signal of the trans-impedance amplifier 22-2 with a reference voltage Vref (for example, an average voltage of the output signal of the trans-impedance amplifier 22-2).

FIG. 11 shows an example of a storage system to which the optical transmission system is applied.

The storage system comprises a device 30 such as a solid state drive (SSD) and a hard disk drive, a host 40 which instructs the device 30 to read and write the data, such as a computer or a server, and the optical transmission system 20 which makes a connection between the device and the host.

In the storage system, the device 30 and the host 40 are connected under interface standards such as Serial Advanced Technology Attachment (Serial ATA or SATA), Serial Attached Small Computer System Interface (Serial Attached SCSI or SAS), and Peripheral Component Interconnect Express (PCIe). A high-speed signal transmission (for example, 12 Gbps) is used under the interface standards. Use of the above-explained optical transmission system as the optical transmission system 20 is therefore effective.

CONCLUSION

As explained above, the high-speed signal transmission can be implemented by the embodiment.

The embodiments are not limited to the above-described embodiment. The blocks, circuits in the blocks, elements in the circuits, and the like explained in the above-described embodiment are mere examples and can be arbitrarily replaced with alternatives having the same functions.

In the above-described embodiment, for example, the MOS transistor can be replaced with a field-effect transistor other than the MOS transistor, a bipolar transistor, a Bi-CMOS transistor or the like. Various light emitting elements such as a light emitting diode, a semiconductor laser, and the like can be used as the light emitting element. Various photodetectors such as a PIN photodiode, an MSM photodiode, an avalanche photodiode, a photoconductor and the like can be used as the photodetector.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A current outputting circuit comprising:
   an output node;
   a first circuit outputting a first signal and a second signal based on an input signal, the first and second signals having phases of complementary relationship; and
   a second circuit outputting an output current from the output node based on the first and second signals,
   wherein the second circuit comprises:
   a first current source with a first terminal and a second terminal, the first terminal being connected to a first power source; and
   a first transistor with a third terminal, a fourth terminal and a fifth terminal, the first signal being input to the third terminal, the fourth and fifth terminals sandwiching a first current path controlled by the first signal, the fourth terminal being connected to the second terminal, the fifth terminal being connected to the output node, wherein the second signal is input to the fifth terminal.

2. The circuit of claim 1, wherein
   the second circuit further comprises a capacitor connected between the fourth terminal and the first power source.

3. The circuit of claim 1, wherein
   the second circuit further comprises a second current source with a sixth terminal and a seventh terminal, the sixth terminal being connected to the first power source, the seventh terminal being connected to the output node.

4. The circuit of claim 1, wherein
   the first circuit comprises:
   a second current source with a sixth terminal and a seventh terminal, the sixth terminal being connected to a second power source;
   a second transistor with an eighth terminal, a ninth terminal and a tenth terminal, the input signal being input to the eighth terminal, the ninth and tenth terminals sandwiching a second current path controlled by the input signal, the ninth terminal being connected to the seventh terminal, the tenth terminal being connected to a third power source; and
   a third transistor with an eleventh terminal, a twelfth terminal and a thirteenth terminal, an inversion signal of the input signal being input to the eleventh terminal, the twelfth and thirteenth terminals sandwiching a third current path controlled by the inversion signal, the twelfth terminal being connected to the seventh terminal,
   wherein the first signal is output from the tenth terminal and the second signal is output from the thirteenth terminal.

5. The circuit of claim 4, wherein
   the first circuit further comprises a resistance element connected between the tenth terminal and the third power source.

6. The circuit of claim 1, wherein
   the output current drives a light emitting element connected between the output node and a second power source.

7. The circuit of claim 6, wherein
   the first power source has a voltage lower than a voltage of the second power source.

8. The circuit of claim 7, wherein
   the first transistor is an N-channel MOSFET.

9. The circuit of claim 6, wherein
   the first power source has a voltage higher than a voltage of the second power source.

10. The circuit of claim 9, wherein
    the first transistor is a P-channel MOSFET.

11. The circuit of claim 1, wherein
    the input signal is a differential signal including a normal phase signal and a reverse phase signal.

12. An optical transmitter comprising:
    the current outputting circuit of claim 1; and
    a light emitting element connected between the output node of the current outputting circuit and a second power source.

13. The optical transmitter of claim 12, wherein
    the light emitting element is a vertical cavity surface emitting laser (VCSEL).

14. An optical transmission system comprising:
    the optical transmitter of claim 12; and
    an optical receiver receiving an optical signal from the light emitting element.

* * * * *